(12) United States Patent
Yuen et al.

(10) Patent No.: US 8,890,312 B2
(45) Date of Patent: Nov. 18, 2014

(54) HEAT DISSIPATION STRUCTURE WITH ALIGNED CARBON NANOTUBE ARRAYS AND METHODS FOR MANUFACTURING AND USE

(75) Inventors: Matthew Ming Fai Yuen, Hong Kong (CN); Kai Zhang, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 463 days.

(21) Appl. No.: 11/752,955

(22) Filed: May 24, 2007

(65) Prior Publication Data

US 2008/0001284 A1  Jan. 3, 2008

Related U.S. Application Data

(60) Provisional application No. 60/808,433, filed on May 26, 2006.

(51) Int. Cl.
*H01L 23/34* (2006.01)
*H01L 23/373* (2006.01)

(52) U.S. Cl.
CPC .......... *H01L 23/373* (2013.01); *Y10S 977/742* (2013.01)
USPC ......................................... 257/712; 977/742

(58) Field of Classification Search
CPC ............... H01L 2924/0132; H01L 2924/00; H01L 2924/01027; H01L 2924/00014; H01L 2224/73253; H01L 2924/01006; H01L 23/373; H01L 2924/16152; H01L 2224/05624; H01L 2224/05655; H01L 2224/48091; H01L 2924/01079; H01L 2224/04

USPC ......... 257/712, 706, 713, 720, E23; 438/119, 438/122; 361/704–709; 165/185; 977/742
See application file for complete search history.

(56) References Cited

U.S. PATENT DOCUMENTS 6,856,016 B2 * 2/2005 Searls et al. .................. 257/720
6,891,724 B2   5/2005 De Lorenzo et al.
(Continued)

FOREIGN PATENT DOCUMENTS

CN  2672867 Y  1/2005
CN  1623230 A  6/2005

OTHER PUBLICATIONS

M.J. Biercuk, M.C. Llaguno, M. Radosavlijevic, J.K. Hyun, A.T. Johnson, J. E. Fisher, "Carbon Nanotube Composites for Thermal Management", Appl. Phys. Lett., vol. 80, No. 15 (2002) pp. 2767-2769.

(Continued)

*Primary Examiner* — Duy T Nguyen
(74) *Attorney, Agent, or Firm* — Amin, Turocy & Watson, LLP

(57) ABSTRACT

A heat dissipation structure with aligned carbon nanotube arrays formed on both sides. The carbon nanotube arrays in between a heat source and a cooler are used as thermal interface material extending and dissipating heat directly from a heat source surface to a cooler surface. In some embodiments, an adhesive material can be used to dispense around carbon nanotube arrays and assemble the heat dissipation structure in between a heat source and a cooler. In some other embodiments, carbon nanotube arrays are formed on at least one of a heat source surface and a cooler surface and connect them together by further growing. The carbon nanotube arrays can be exposed to the environment instead of being in between a heat source and a solid cooler, and can serve as fins to enlarge heat dissipation area and improve thermal convection.

21 Claims, 7 Drawing Sheets

(56) References Cited

U.S. PATENT DOCUMENTS

| | | | |
|---|---|---|---|
| 6,924,335 | B2 | 8/2005 | Fan et al. |
| 6,965,513 | B2 | 11/2005 | Montgomery et al. |
| 2002/0023733 | A1* | 2/2002 | Hall et al. .................. 165/80.3 |
| 2002/0185745 | A1* | 12/2002 | Ma et al. ..................... 257/778 |
| 2003/0117770 | A1 | 6/2003 | Montgomery et al. |
| 2003/0183945 | A1* | 10/2003 | Park .............................. 257/777 |
| 2004/0126931 | A1* | 7/2004 | Hembree .................... 438/122 |
| 2004/0164402 | A1* | 8/2004 | Yoshimura .................. 257/706 |
| 2004/0261987 | A1* | 12/2004 | Zhang et al. ................ 165/183 |
| 2004/0266065 | A1* | 12/2004 | Zhang et al. ................ 438/122 |
| 2005/0061496 | A1* | 3/2005 | Matabayas .................. 165/185 |
| 2005/0073042 | A1* | 4/2005 | Hirano et al. ............... 257/717 |
| 2005/0077599 | A1* | 4/2005 | Miura et al. ................. 257/669 |
| 2005/0126766 | A1* | 6/2005 | Lee et al. .................... 165/133 |
| 2005/0139991 | A1* | 6/2005 | White et al. ................ 257/706 |
| 2005/0145367 | A1* | 7/2005 | Hannah et al. .............. 165/80.3 |
| 2006/0032622 | A1* | 2/2006 | Yen et al. .................... 165/185 |
| 2006/0033203 | A1 | 2/2006 | Leu et al. |
| 2006/0068195 | A1 | 3/2006 | Majumdar et al. |
| 2006/0251897 | A1* | 11/2006 | Pan et al. .................... 428/408 |
| 2007/0116957 | A1* | 5/2007 | Pan et al. .................... 428/408 |
| 2010/0326740 | A1* | 12/2010 | Hall et al. ................... 175/428 |

OTHER PUBLICATIONS

C.H. Liu, H. Huang, Y.Wu, S.S, Fan, "Thermal Conductivity Improvement of Silicone Elastomer with Carbon Nanotube Loading", Appl. Phys. Lett., vol. 84, No. 21 (2004), pp. 4248-4250.

H. Huang, C.H. Liu, Y. Wu, S.S. Fan, "Aligned Carbon Nanotube Composite Films for Thermal Management", Advanced Materials, vol. 17 (2005), pp. 1652-1656.

J. Xu, T.S. Fisher, "Enhanced Thermal Contact Conductance Using Carbon Nanotube Arrays", Proc. 9th Intersociety Conference on Thermal and Thermomechanical Phenomena in Electronic Systems, vol. 2, Jun. 2004, pp. 549-555.

X. Hu, A.A. Padilla, J. Xu, T.S. Fisher, K.E. Goodson, "Thermal Characterization of Vertically-Oriented Carbon Nanotubes on Silicon", Proc. 21st IEEE Semi-Therm Symposium, 2005.

P. Kim, L. Shi, A. Majumdar, and P. L. McEuen, "Thermal Transport Measurements of Individual Multiwalled Nanotubes", The American Physical Society, Physical Review Letters, vol. 87, p. 215502 (2001).

K. Zhang, Matthew M.F. Yuen, N. Wang, J.Y. Miao, David G.W. Xiao, H.B. Fan, "Thermal Interface Material with Aligned CNT and its Application in HB-LED Packaging", 2006 Electronic Components and Technology Conference, pp. 177-182.

Jun Xu and Timothy S. Fisher, "Enhanced Thermal Contact Conductance Nanotube Array Interfaces", IEEE Transactions on Components and Packaging Technologies, vol. 29, No. 2, Jun. 2006.

Office Action mailed Oct. 16, 2009 for Chinese Patent Application No. 200710106382.6, 9 pages.

M.J.Birecuk, M.C.Llaguno, M.Radosavijevic, J.K.Hyun, A.T. Johnson, J.E.Fischer "Carbon nanotubes composites for thermal management", Appl.Phys. Lett., vol. 80, No. 15 (2002), pp. 2767-2769.

C.H.Liu, H.Huang, Y.Wu, S.S.Fan, "Thermal conductivity improvements of silicone elastomer with carbon nanotubes loading," Appl. Phys. Lett., vol. 84, No. 21 (2004) pp. 4248-4250.

H.Huang, C.H.Liu, Y.Wu, S.S.Fan, Aligned Carbon Nanotube Composite Films for Thermal Management, Advanced Materials, vol. 17 (2005), pp. 1652-1656.

J.Xu, T.S.Fisher, "Enhanced thermal contract conductance using carbon nanotube arrays", Proc.9th Intersociety Conference on Thermal and thermomechanical Phenomena in Electronic Systems, vol. 2, Jun. 2004, pp. 549-555, (2004).

X.Hu., A.A.Padilla, J.Xu, T.S.Fisher, K.E. Goodson "Thermal characterization of vertically-oriented carbon nanotubes on silicon", Proc 21st IEEE Semi-Therm Symposium, 2005.

\* cited by examiner

- - - - → Heat convection path
⎯⎯→ Heat conduction path

HEAT DISSIPATION STRUCTURE WITH ALIGNED CARBON NANOTUBE ARRAYS AND METHODS FOR MANUFACTURING AND USE

CROSS-REFERENCE TO OTHER APPLICATION

The present application claims priority under 35 U.S.C. §119(e) of U.S. Patent Application No. 60/808,433, filed May 26, 2006, and entitled Heat Dissipation Structure with Carbon Nanotube Arrays and Method for Manufacturing the Same.

BACKGROUND OF THE INVENTIONS

The present application generally relates to thermal management solutions, and more specifically to heat dissipation structures using aligned carbon nanotube arrays, and to methods of fabricating such a heat dissipation structure and applying it to a package.

With the development of microelectronic systems, for example, high brightness light emitting diode (HB-LED) for solid-state lighting, significant challenges of thermal management have to be faced to meet the increasing requirements of smaller profile, higher performance and longer product life time. More heat generated by devices needs to be effectively dissipated from a smaller area. Several kinds of heat sink are developed to expect to dissipate more heat from device to the environment. However it is very important to first conduct heat from device to heat sink by thermal interface materials. Unfortunately, conventional thermal interface materials, such as thermal grease thermal adhesives, phase change materials, etc., cannot meet the increasing requirement of the heat dissipation from a small area. Carbon nanotube (CNT) is an attractive candidate to improve the thermal performance of thermal interface materials because of their ultrahigh thermal conductivity up to 3000 W/m·K for multi-walled carbon nanotube (MWNT). Further information regarding CNT properties may be found in the *Journal of the American Physical Society, Physical Review Letters*, Vol. 87, page 215502 (2001), herein incorporated by reference. However thermal interface materials with randomly directed carbon nanotubes dispersed in epoxy resins or other matrix materials does not perform well because of the highly anisotropic nature of the thermal conduction by carbon nanotubes. Aligned carbon nanotube arrays directly extending from a first surface, for example a heat source surface, to a second surface, for example a cooler surface, is expected.

U.S. Pat. Nos. 6,965,513 and 6,924,335, incorporated by reference herein for all purposes, disclose thermal interface materials with carbon nanotube bundles embedded in matrix materials. However, the phonon heat transfer modes in matrix materials and carbon nanotubes are not compatible, which significantly limits the advantage of heat conduction by carbon nanotube. In addition, solidified matrix material is less flexible to fill in the uneven surfaces of heat source and heat sink. As a result, the thermal conductivity of thermal interface material with aligned carbon nanotube arrays in matrix is only 1.21 W/m·K and the contact thermal resistance is more than 50 mm²·K/W. Additional information regarding the thermal conductivity of thermal interface materials are detailed in Advanced Materials, Vol. 17, page 1652 (2005) incorporated by reference herein.

U.S. Pat. No. 6,856,016 and U.S. Patent Application Publication US 2004/0150100, both incorporated by reference herein for all purposes, disclose a thermal interface layer with carbon nanotubes grown on the surface of semiconductor die. However, the processes are not compatible for carbon nanotubes synthesis and device fabrication. If carbon nanotubes are grown before device fabrication, the decreased wafer cleanliness and ability to protect carbon nanotubes will make it difficult to conduct device fabrication using normal processes and equipments. Alternatively, if a device is fabricated before carbon nanotubes growth, the high temperature required by growing carbon nanotubes will damage the device or increasing the device cost by changing the processes and materials.

As for the connecting methods, U.S. Patent Application Publication U.S. 2004/0261987, incorporated by reference herein for all purposes, use an adhesion promoting layer to connect heat source and the array of carbon nanotubes. However, it is very difficult to form a very thin layer so that the tips of carbon nanotubes can still make contact with the heat source surface. As a result, there is actually another added layer with additional thermal resistance, which reduces the thermal performance of the thermal management solution. In U.S. Pat. No. 6,891,724, incorporated by reference herein for all purposes, carbon nanotubes grown from the opposed surfaces intermesh as the surfaces are mated. However, it is difficult for carbon nanotubes from any surface to extend directly to the other surface.

SUMMARY OF THE INVENTIONS

The present inventions provide a new way to use high thermal conductivity carbon nanotube (CNT) arrays. To avoid the process incompatibility of carbon nanotube growth and device fabrication the aligned CNT arrays are formed on heat dissipation structure surfaces instead of a heat source surface. To simplify the fabrication process and decrease the cost, aligned CNT arrays are grown on both sides of heat dissipation structure surfaces at one time. The heat dissipation structure with CNT arrays are used to directly dissipate heat from a heat source to a cooler. The CNT arrays in between a heat source and a cooler are used as thermal interface material extending and dissipate heat directly from a heat source surface to a cooler surface. The CNT arrays exposed to the environment instead of being in between a heat source and a solid cooler serve as fins to enlarge heat dissipation area and improve thermal convection.

In various embodiments, the disclosed inventions provide several of the following advantages:
  lower cost and more scalable manufacturing
  fast and simple process using efficient CNT synthesis and assembly method
  better heat sinking
  better convective cooling
  Other advantages and detailed novel features of the inventions will be explained with the descriptions of the example drawings.

BRIEF DESCRIPTION OF THE DRAWINGS

The embodiments of the inventions are illustrated by examples shown in the following figures but not limited in these figures. These drawings are not necessarily drawn to scale. The inventions will be described and explained with additional specificity and detail through the use of the accompanying drawings in which:

FIG. 5 is a detailed view of a heat dissipation structure showing some connecting methods with adhesive materials formed around the outside edges of the gap between the coupling heat source surface and cooler surface with carbon nanotube arrays in between;

DETAILED DESCRIPTION OF THE PREFERRED EMBODIMENTS

Figure 1:
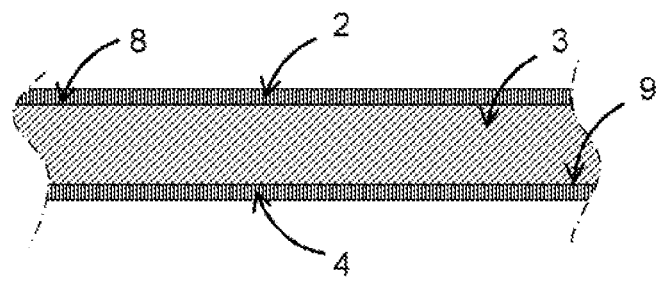
FIG. 1 is a heat dissipation structure with carbon nanotube arrays on both sides, showing the surfaces of the heat dissipation structure are fully covered with grown carbon nanotube arrays without any pattern.

The present application discloses embodiments of a heat dissipation structure with aligned carbon nanotube (CNT) arrays on both sides that serve as thermal interface material or heat dissipation fins for enlarging the thermal convection area and methods for manufacturing it. Details are set forth to provide a thorough understanding of the embodiments of the present inventions with the help of the drawings but not limited to. The features, structures, materials, and characteristics of the inventions can be combined in any suitable manner in one or more embodiments.

In one embodiment, to simplify the fabrication process and decrease the cost, the aligned CNT arrays are grown on both sides of heat dissipation structure surfaces at one time. No catalyst is predeposited on heat dissipation structure surfaces or pretreated for growing. Sublimed catalyst, such as Ferrocene, is used as raw material. In addition, carbon nanotubes are synthesized on heat dissipation structure surfaces without pattern or pretreatment. Therefore, no microelectronic fabrication is needed for manufacturing the inventive heat dissipation structure with carbon nanotube arrays. Thermal chemical vapor deposition is adopted to synthesize carbon nanotube arrays because it is much cheaper than plasma enhanced chemical vapor deposition. A heat dissipation structure with CNT arrays can be simply connected to the heat source surface and cooler surface by mechanical attachment with contact pressure.

In some embodiments for high performance application with special requirements, modification layers and catalyst predeposition may be needed to modify the thermal and other properties of heat dissipation structure with CNT arrays.

In some embodiments, an adhesive material can be formed around the outside edges of the gap between heat source and a cooler with CNT arrays in between. This connecting method avoids adding an additional thermal resistance to the heat dissipation structure.

In some embodiments, CNT arrays are directly formed on at least one of the heat source surface and cooler surface and then connected together by further growth. The strong or good bonding formed by direct growth of the CNT arrays on both coupling surfaces is beneficial to reduce the thermal contact resistance.

In some other embodiments, some CNT arrays are exposed to the environment to which the heat will dissipate instead of being in between a heat source and a solid cooler. In this case, carbon nanotube arrays serve as fins of heat dissipation structure to significantly enlarge the heat dissipation area and dissipate heat more effectively to the environment by thermal convection.

The measured thermal contact resistance of CNT thermal interface material (TIM) synthesized by thermal chemical vapor deposition (CVD) is only about 15 $mm^2W/K$, which is much less than that of commercial available TIM. Further information regarding TIMs is disclosed in the *Proceedings of the 56th Electronics Components and Technology Conference*, pp. 177-182, herein incorporated by reference. The measured thermal contact resistance of heat spreader with CNT arrays on both sides synthesized by thermal CVD is only about 51 $mm^2W/K$, which is only 30% of that of conventional heat spreader with TIM. Further experimental results show that CNTs synthesized by Plasma Enhanced Chemical Vapor Deposition (PECVD) has better thermal performance.

References throughout this specification to "heat source" mean a structure that generates heat when operating or only a body with higher temperature, for example, a die or a device or a module or combination of several dies, devices or modules, or even a heat spreader dissipating heat to a heat sink. References throughout this specification to "cooler" mean a structure that serves to absorb heat and may further help dissipate the heat to other media, for example, a heat spreader absorbing heat from a heat source, a heat sink, or even an air environment or a fluid, etc. References throughout this specification to "coupling surface" mean the surface used to connect to other structures or materials.

FIG. 1 shows an embodiment of inventive heat dissipation structure with CNT arrays 2 and 4 grown on heat dissipation structure surfaces 8 and 9. In the present invention, heat dissipation structure 3 can be made of any suitable high thermal conductivity materials, such as silicon, silicon oxide, silicon with silicon oxide layer, glass, some metals such as aluminum, copper, some metal alloys, such as aluminum alloy, copper alloy, or these metals or metal alloys with their oxide layers, or oxide of these metals or metal alloys, or any material containing at least one of the above materials. CNT arrays 2 and 4 can be grown on heat dissipation structure surfaces by thermal chemical vapor deposition, plasma enhanced chemical vapor deposition, arc-discharge, or laser ablation method.

Figure 2:
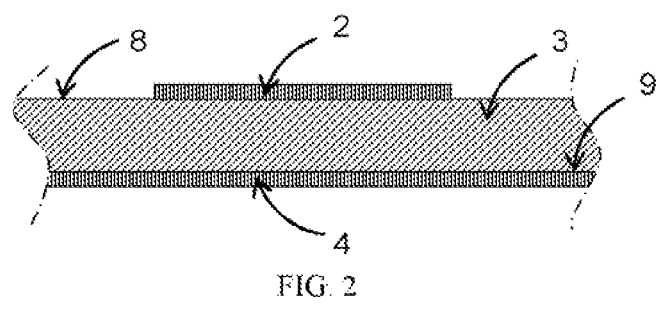
FIG. 2 is a heat dissipation structure with carbon nanotube arrays on both sides, showing an example of carbon nanotubes with pattern on one side.

FIG. 2 shows an embodiment with a smaller area of CNT arrays 2 on heat dissipation structure surface 8 than the area of CNT arrays 4 on heat dissipation structure surface 9 in some specific applications. For example, the area of CNT arrays 2 is the same as the area of heat source surface 6 and the area of CNT arrays 4 is the same as the area of the cooler surface 7. In other embodiment, the area of CNT array 2 and 4 can be larger or smaller than the area of heat source surface 6 and the area of cooler surface 7. Heat dissipation structure surfaces 8 and/or 9 can also be patterned to other desired features to make carbon nanotube arrays grow to the desired pattern in different applications.

Figure 3:
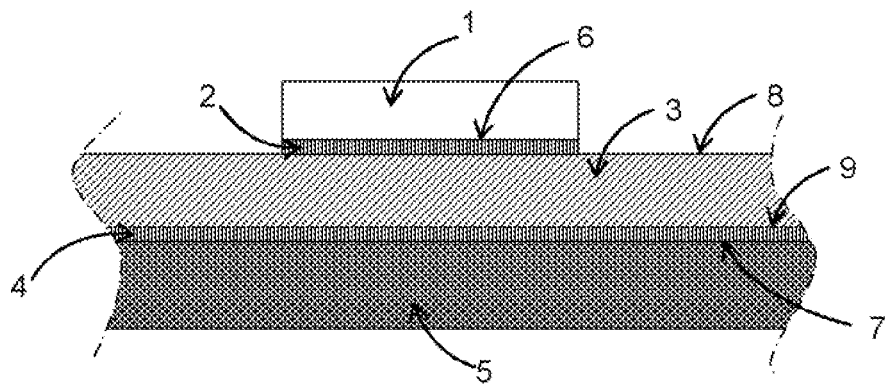
FIG. 3 is a schematic cross sectional side view of an electronic package including a heat dissipation structure with carbon nanotube arrays on both sides in accordance with an embodiment of the present invention.

In FIG. 3, an application of an embodiment of the inventions in an electronic package with the inventive heat dissipation structure is shown schematically. A heat source 1 is connected to a cooler 5 through a heat dissipation structure 3 with carbon nanotube arrays 2 and 4 grown on both sides. In this embodiment, high density carbon nanotubes (CNTs) are grown on heat dissipation structure surfaces 8 and 9 without pattern by chemical vapor deposition using a sublimed catalyst, such as Ferrocene. Other sublimed catalysts can comprise at least one of dicyclopentadienyl iron (Ferrocene), dicyclopentadienyl cobalt (Cobaltocene), dicyclopentadienyl nickel (Nickelocene), iron titanium hydride, cobalt titanium hydride, nickel titanium hydride, or any materials containing at least one of these materials.

A specific example of CNT array growth and CNT array growth conditions including temperature, pressure, source gases, and growth time is provided later in this application.

There is no need for a microelectronic fabrication process to prepare the substrate and catalyst and, as a result, the manufacturing method is easy and low cost. High density CNT arrays are benefit to heat conduction because there are more heat conduction paths. In addition, CNT arrays with higher density can withstand the contact pressure in normal electronic packaging process without collapse. Therefore, aligned CNT arrays 2 are vertically extending from heat source surface 6 to heat dissipation structure surface 8 and CNT arrays 4 vertically extending from heat dissipation structure surface 9 to cooler surface 7, respectively. Under the contact pressure, some tips of CNT arrays 2 fill in the voids of uneven surface 6 and some even insert into the surface 6 of heat source 1. Similarly, some tips of CNT arrays 4 fill in the voids of uneven surface 7 and some even insert into the surface 7 of cooler 5. As a result, the inventive heat dissipation structure 3 with carbon nanotube arrays 2 and 4 as thermal interface material forms a high thermal conductive path from a heat source 1 to a cooler 5.

Figure 4:
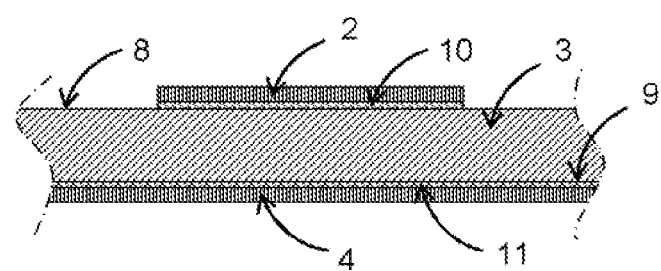
FIG. 4 is a heat dissipation structure with carbon nanotube arrays on both sides having modification layers in between the carbon nanotube arrays and the heat dissipation structure surfaces.

FIG. 4. shows an embodiment with a layer 10 between CNT arrays 2 and heat dissipation structure surface 8 and layer 11 between CNT arrays 4 and heat dissipation structure surface 9.

In some embodiments, the layers 10 and 11 can be a catalyst layer and/or multiple catalyst layers deposited on at least one of heat dissipation structure surfaces 8 and 9 for growing CNT arrays. Iron, nickel, cobalt, aluminum, silicon, copper, platinum, palladium, gold, silver, oxides of these materials, any combination of these materials and/or their oxides, or any materials containing at least one of these materials or their oxides can be the catalyst.

In other embodiments, the layers 10 and 11 can be a modification layer or multiple modification layers formed on at least one of heat dissipation structure surfaces 8 and 9. They may be used to improve the bonding between CNT arrays and heat dissipation structure surfaces, and therefore reduce the thermal contact resistance between them. They may also be used to improve the distribution uniformity of CNT arrays on heat dissipation structure surfaces. Titanium, tungsten, silicon, aluminum, oxide of these materials, any combination of these materials, or any materials containing at least one of them can be used to form the modification layers.

the layers 10 and 11 can also be multiple layers consisting of a catalyst layer and modification layer. In some embodiments, layers 10 and 11 may not be used at all or only one of them be used.

Figure 5:
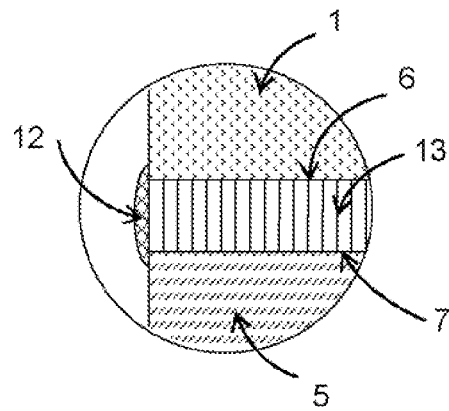
Figure 5:
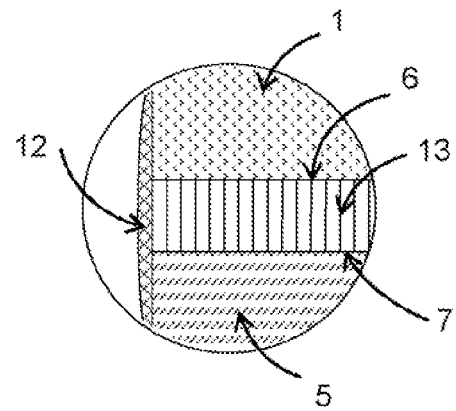
Figure 5:
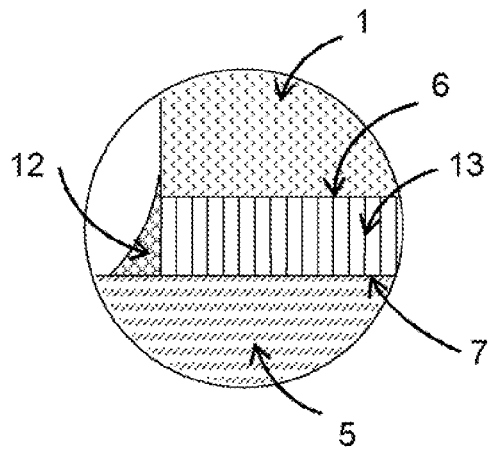

FIG. 5 is a detail part of a heat dissipation structure showing some connecting methods with adhesive materials (e.g., peripheral connecting materials) formed around the outside edges of the gap between a heat source and a cooler where there are CNT arrays grown in between.

In FIGS. 5(a) and (b), the dimensions of the heat source 1 and the cooler 5 are the same. The adhesive material 12 formed around the outside edges of the gap may only cover the gap and connect the heat source 1, CNT arrays 13 and the cooler 5, as shown in FIG. 5(a). It can also extend to a larger area, as shown in FIG. 5(b). The adhesive material can be an epoxy resin with or without fillers, thermal conductive polymers, a low melting metal or alloy, a phase change material, adhesive materials, or any materials containing any of these materials.

In FIG. 5(c), the dimensions of the heat source 1 and the cooler 5 are not the same. The adhesive material 12 formed around the outside edges of the gap may shape like a fillet or any other shapes to connect the heat source 1 and the cooler 5 together with CNT arrays 13 extending from the heat source surface 6 to the cooler surface 7. The adhesive material 12 around the outside edges of the gap can help make CNT arrays have a good contact to the coupling surfaces as well as assembly the heat source and the cooler together. The adhesive material can be epoxy resins with or without fillers, thermal conductive polymers, low melting metals or alloys, phase change materials, adhesive materials, or any materials containing any of these materials.

Figure 6:
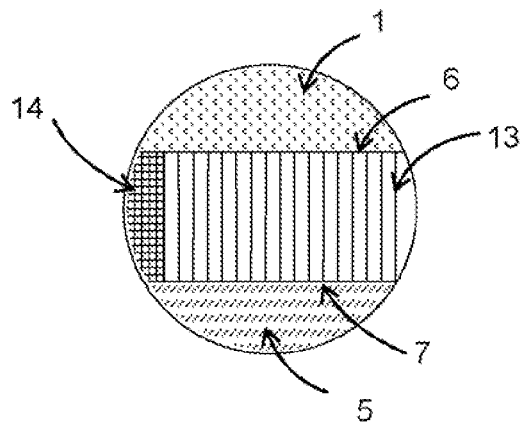
FIG. 6 is a detailed view of a heat dissipation system with carbon nanotube arrays directly grown on a heat source surface and a cooler surface and directly connected together by further growth.

FIG. 6 is a detailed view of one embodiment of an inventive heat dissipation system. In this embodiment, CNT arrays 13 are directly grown face-to-face on a heat source surface 6 and a cooler surface 7 and further grow to connect together. In another embodiment, CNT arrays 13 can start to grow on one of the two coupling surfaces 6 and 7 till bonded to the opposite surface.

Figure 7:
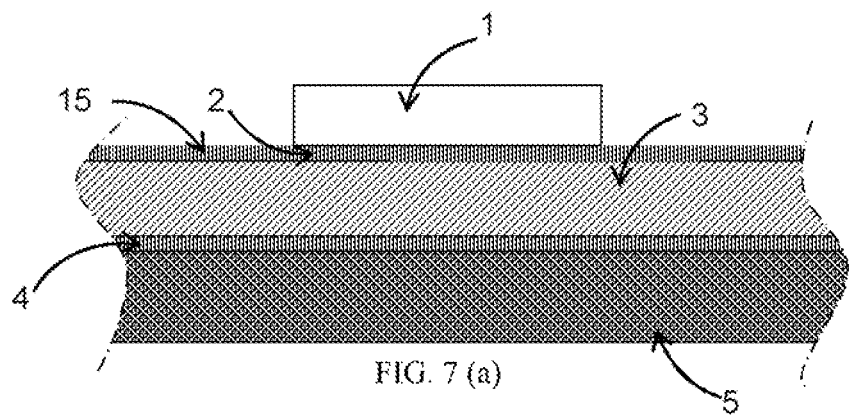
FIG. 7 shows some applications of the heat dissipation structure with some carbon nanotube arrays exposed to the environment.
Figure 7:
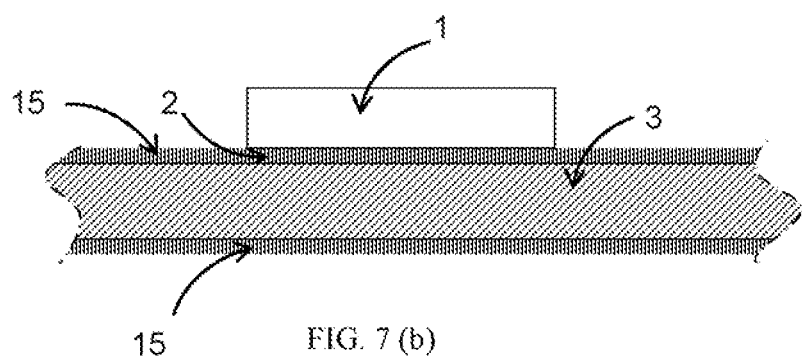
Figure 7:
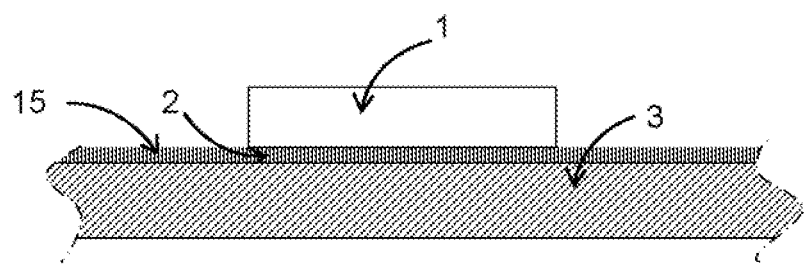
Figure 7:
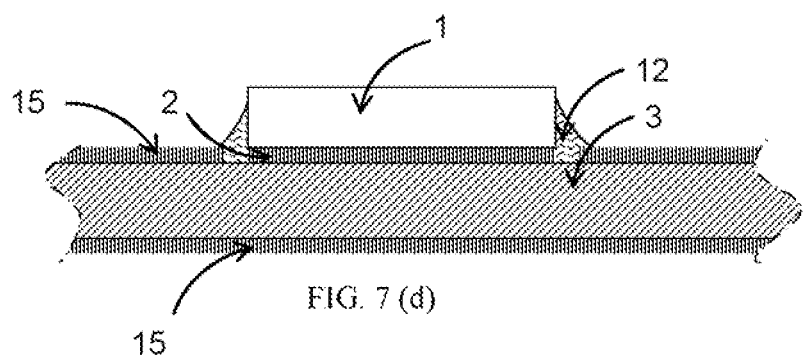

FIG. 7 shows embodiments with some CNT arrays exposed to environment. In this case, CNT arrays serve as fins of heat dissipation structure to significantly enlarge the heat dissipation area and dissipate heat more effectively to the environment by thermal convection.

In FIG. 7(a), heat dissipation structure serves as a heat spreader. CNT arrays 15 that are not in between the heat source, the heat dissipation structure and the cooler serve as fins to improve heat convection.

In FIG. 7(b), heat dissipation structure serves as a heat sink. Part of CNT arrays on surface 8 of heat dissipation structure and all CNT arrays on surface 9 of heat dissipation structure function as fins to enlarge heat convection area.

In FIG. 7(c), heat dissipation structure serves as a heat sink. Only part of CNT arrays on surface 8 of heat dissipation structure functions as fins to enlarge heat convection area. There are no CNT arrays grown on surface 9 of heat dissipation structure.

CNT arrays can be formed with desired pattern. For example, in FIG. 7(d). CNT arrays are formed with the center area the same as the heat resource and leaving a gap around the center CNT arrays to apply the adhesive material 12 (e.g., a peripheral connecting material). More CNT arrays can be further grown on the outer surface to serve as fins to improve heat convection. CNT arrays can also be grown to form CNT bundles instead of uniformly distributed CNTs.

Figure 8:
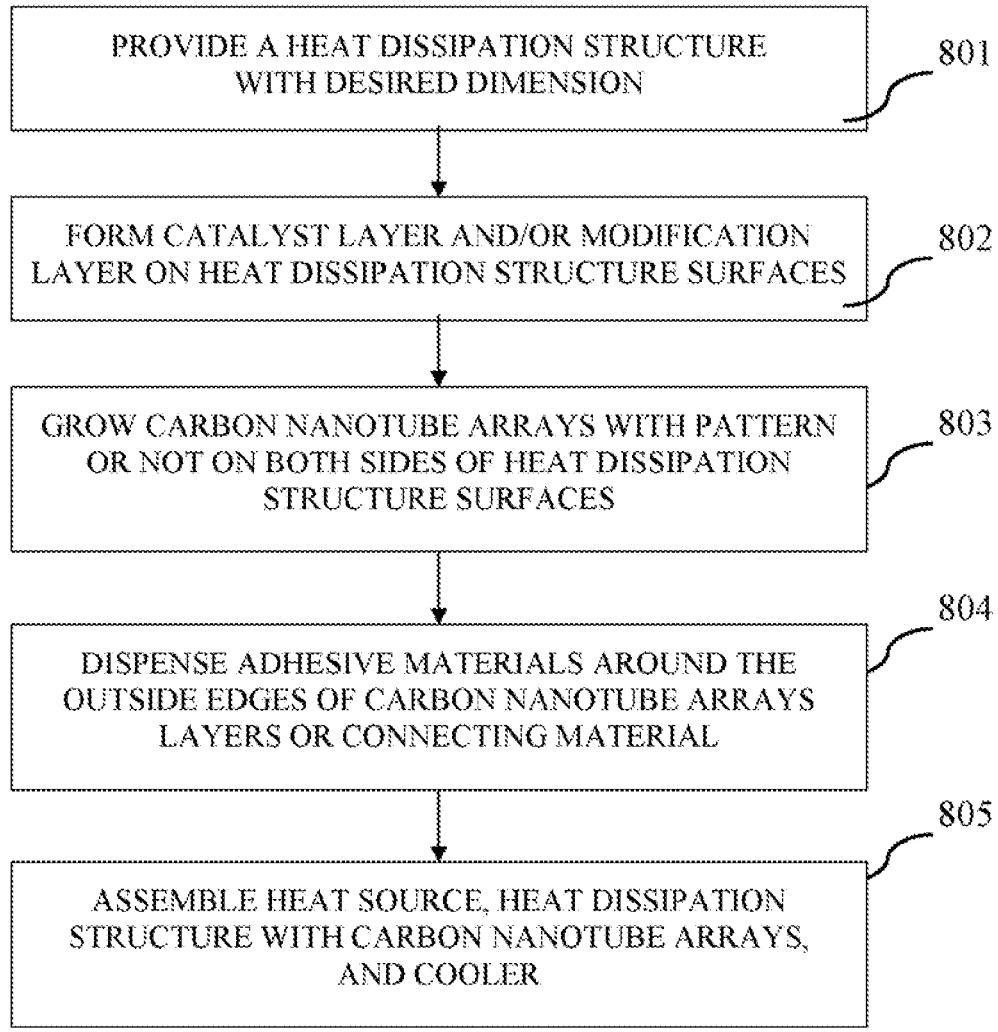
FIG. 8 is a general flowchart for manufacturing a heat dissipation structure in accordance with the present invention.

FIG. 8 shows a flowchart for manufacturing the heat dissipation structure in accordance with the present invention. The method comprises the following steps:

Step 801: providing a heat dissipation structure 3 with the desired dimension.

Step 802: forming catalyst layers and/or modification layers 10 and 11 on at least one of heat dissipation structure surfaces 8 and 9; or no catalyst layer or modification layers at all.

Step 803: growing carbon nanotube arrays 2 and 4 on both sides of heat dissipation structure surfaces 8 and 9.

Step 804: forming adhesive material 12 around outside edges of CNT arrays; or no adhesive material at all.

Step 805: assembling the heat source 1, heat dissipation structure 3 with CNT arrays 2 and 4 on both sides and the cooler 5 by mechanical contact pressure or by solidifying the adhesive material 12.

Figure 9:
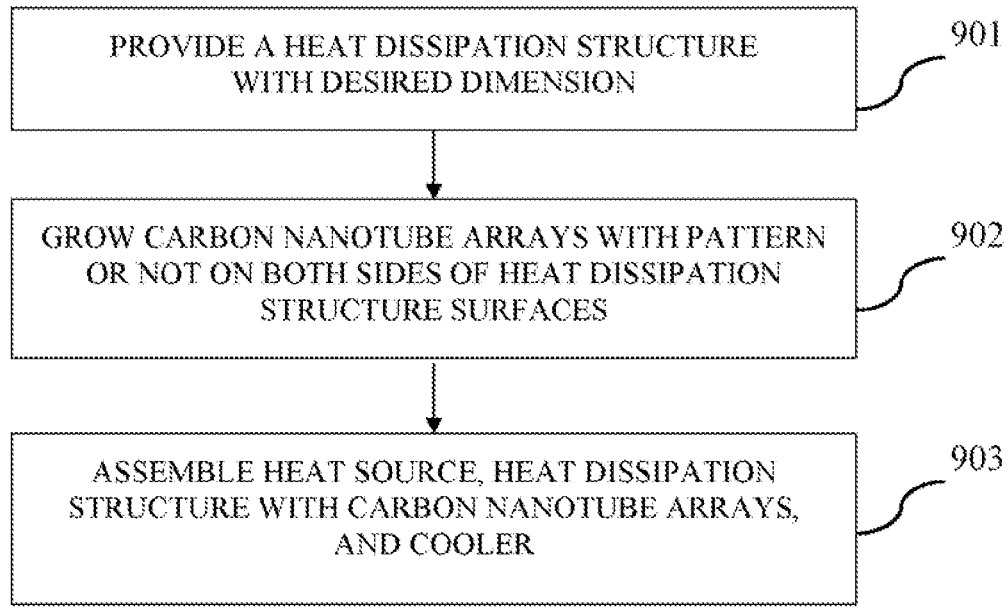
FIG. 9 is a flowchart for manufacturing an embodiment of a heat dissipation structure in accordance with the present invention with the least processes.

FIG. 9 shows a flowchart for manufacturing one embodiment of the heat dissipation structure in accordance with the present invention with the least processes. The method comprises the following steps:

Step 901: providing a heat dissipation structure 3 with the desired dimension.

Step 902: growing carbon nanotube arrays 2 and 4 on both sides of heat dissipation structure surfaces 8 and 9 at one time with sublimed catalyst such as Ferrocene. No pretreatment of heat dissipation structure surfaces is needed. No pretreatment or deposition of catalyst is needed.

Step 903: assembling the heat source 1, heat dissipation structure 3 with carbon nanotube arrays 2 and 4 on both sides and the cooler 5 by mechanical contact pressure.

Figure 10:
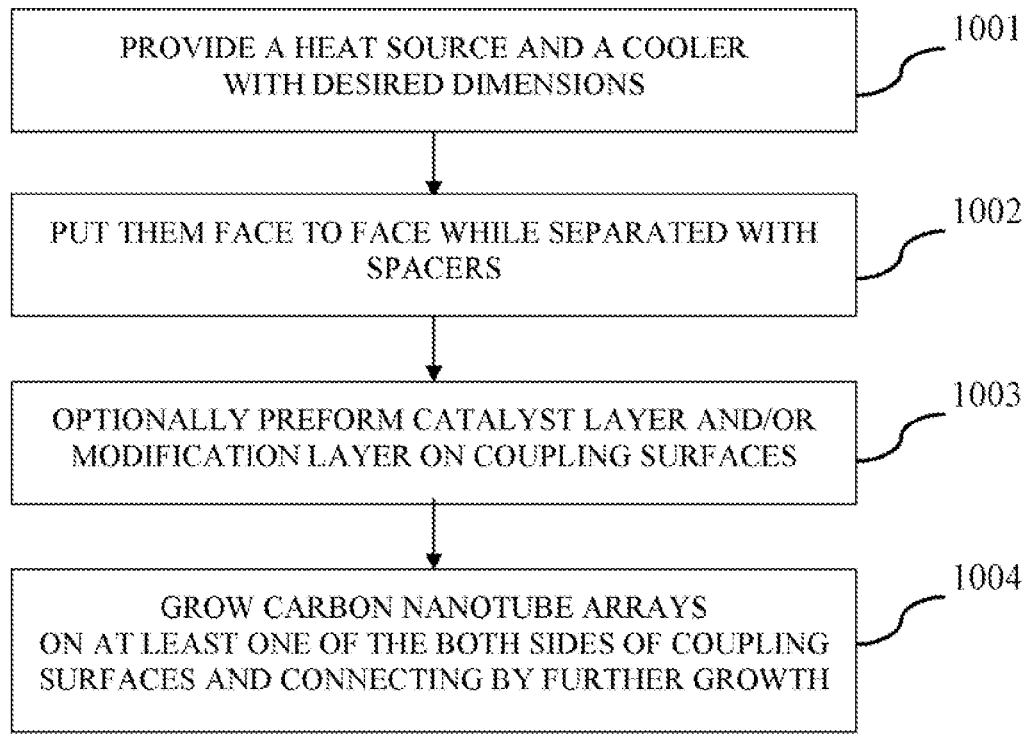
FIG. 10 is a general flowchart for manufacturing a heat dissipation system with carbon nanotube arrays directly grown on a heat source surface and a cooler surface and further growing to connect together.

FIG. 10 shows a flowchart for manufacturing one embodiment of the inventive heat dissipation structure with CNT arrays directly grown on a heat source surface and a cooler surface and further growing to connect together. The method comprises the following steps:

Step 1001: providing a heat source 1 and a cooler 5 with desired dimensions.

Step 1002: putting the heat source 1 and the cooler 5 together while leaving them separated by spacers 14.

Step 1003: forming catalyst layers and/or modification layers 10 and 11 on at least one of the heat source surface 6 and the cooler surface 7; or no catalyst layer or modification layer at all.

Step 1004 growing CNT arrays 13 on the heat source surface 6 and/or the cooler surface 7 and further growing to connect them together.

Figure 11:
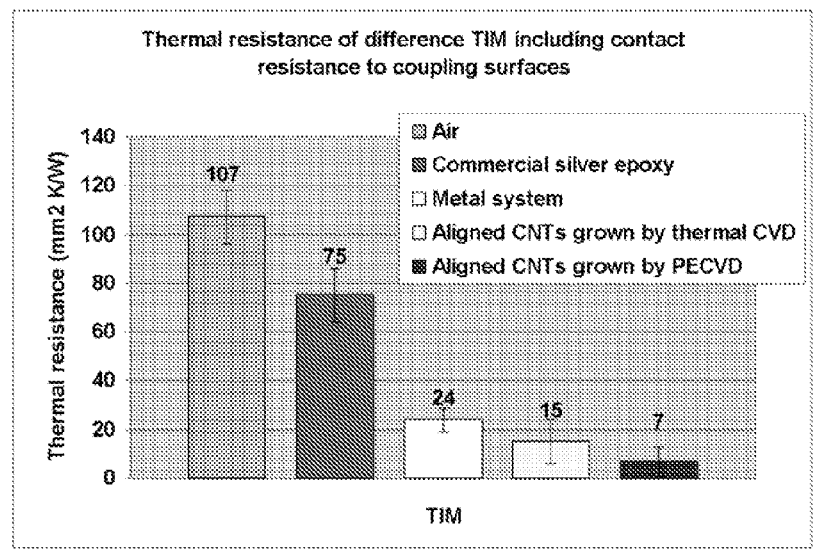
FIG. 11 is a chart showing the experimental results of thermal resistance of different TIM.

FIG. 11 is the experimental results of thermal resistance of different thermal interface material (TIM). The thermal resistance includes the contact resistance of TIM and coupling surfaces as well as thermal resistance of TIM layer. The thermal resistance of CNT-TIM is much less than that of commercial TIM with silver particles in epoxy resin. It is also less than that of solder TIM with Titanium (Ti) and copper (Cu) as the supporting layers. CNT-TIM synthesized by Plasma Enhanced Chemical Vapor Deposition (PECVD) has less thermal resistance than CNT-TIN synthesized by thermal chemical vapor deposition (CVD). However, PECVD equipment is more expensive than thermal CVD furnace.

Figure 12:
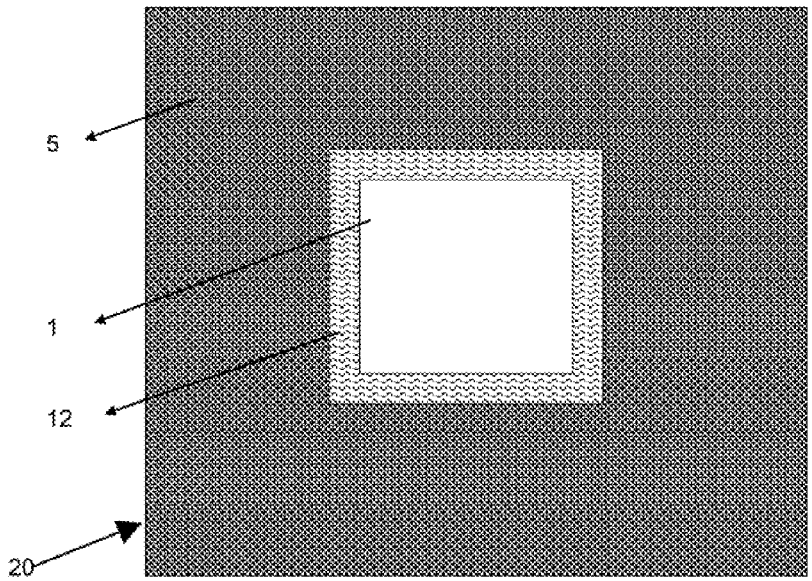
FIG. 12 is a plan view of a device illustrating the relationship between the adhesive material and a heat source as well as a heat sink.

FIG. 12 is a view of a is a plan view of a high brightness light emitting diode device package 20 that shows the structural relationship of the heat sink 5, adhesive material 12 and the device 1.

Figure 13:
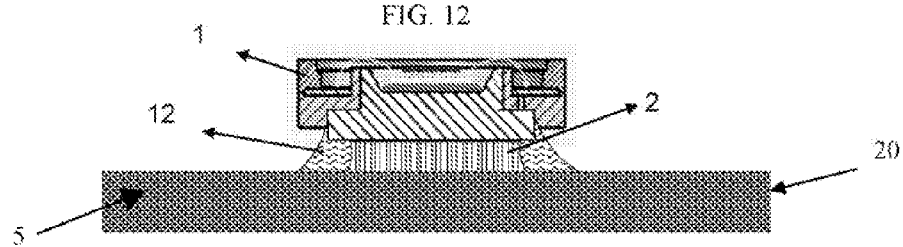
FIG. 13 is a side view of the device of FIG. 12 illustrating the relationship between a heat source, the CNT-TIM, the adhesive material and a heat sink.

FIG. 13 illustrates a side view of the high brightness light emitting diode device package 20 that depicts the relationship of the CNT-TIM 2 to the adhesive material 12 and the heat sink 5.

Figure 14:
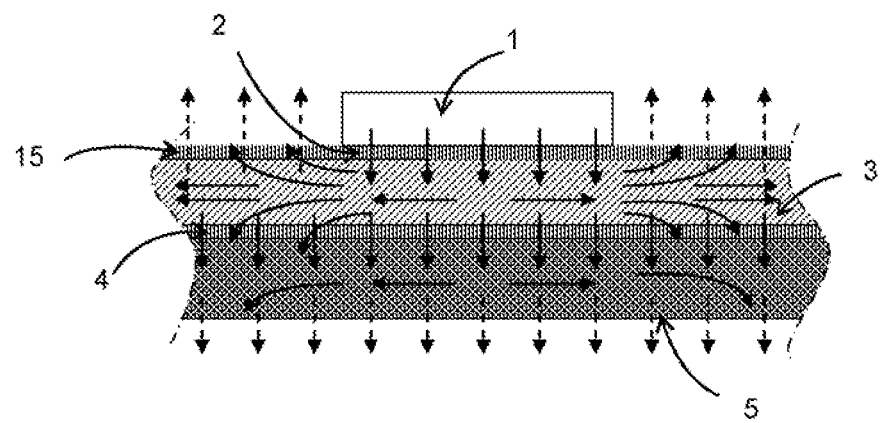
FIG. 14 illustrates the heat conduction and heat convection flow paths of a CNT structure.

FIG. 14 illustrates a two-sided CNT array structure that shows the convective heat transfer flow and conductive heat transfer flow through the structure of one embodiment of the invention.

Figure 15:
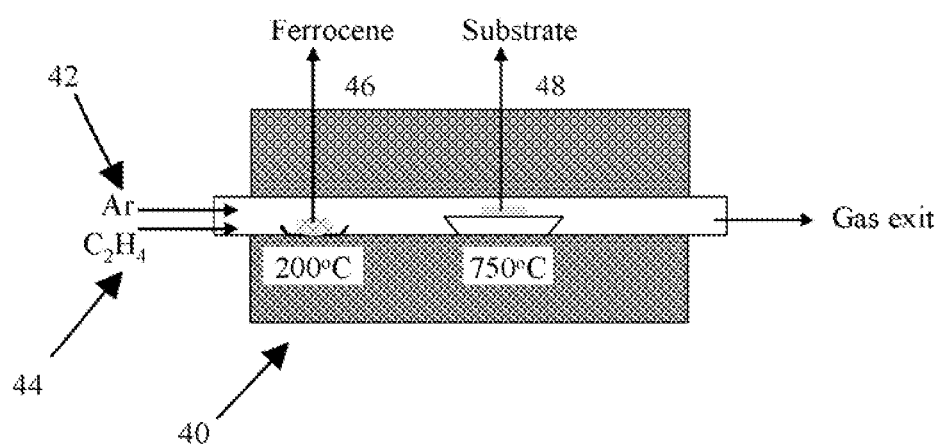
FIG. 15 illustrates a schematic of a thermal Chemical Vapor Deposition (CVD) system for CNT synthesis.

FIG. 15 is merely one embodiment of a CNT synthesis process in which a CNT arrays has been synthesized by thermal Chemical Vapor Deposition (CVD) using sublimed Ferrocene.

In this embodiment, a one-stage CVD furnace system 40 was employed to grow CNT arrays on Silicon (SI) based substrates 48. The diameter of the internal quartz reactor (not shown) is 1.5 inches. The flow rate of gases was controlled by mass controllers. A volume of Argon (Ar) 42 equaling 200 standard cubic centimeters per minute (sccm) was input as the carrier gas and 50 sccm of Ethylene 44 was used as one part of the carbon source. 100-200 milligrams (mg) of Ferrocene 46 was used as a catalyst and as another part of the carbon source. The Ferrocene 46 was introduced into the quartz reactor of the system at a location having a temperature of 200 degrees Celsius. CNTs were grown at 750 degrees Celsius (750° C.) for 10-20 minutes. Finally, the whole system was naturally cooled down to room temperature. During the CNT synthesis the pressure in the quartz tube was kept at atmospheric pressure.

In one embodiment, there is disclosed a packaged semiconductor structure, comprising a heat source, a heat sink, an aligned array of carbon nanotubes which thermally connects said source to said sink; and a peripheral connecting material (e.g., an adhesive material) which runs along at least some edges of said aligned array, while mechanically contacting said source and said sink to provide a fixed positional relationship there between.

In another embodiment there is disclosed a packaged semiconductor structure, comprising an extended structure which carries heat; and first and second mutually separate aligned carbon nanotube arrays which are thermally connected to opposite surfaces of said extended structure, wherein said first array terminates in a connection to another heat conducting structure, and said second array terminates in bare carbon nanotube ends.

In some embodiments, a method of transferring heat from a microelectronic heat source, comprises conducting heat through an if array of aligned nanotube fibers; separating a heat source and heat sink by placing a spacer in a positional relationship with the heat source and heat sink; and mechanically stabilizing a relative position of the heat source to the heat sink using an adhesive material (e.g., a peripheral connecting material).

In some embodiments there is disclosed a method of operating an electronic system, comprising operating at least one electronic component, coupling heat from said electronic component into a thermal plane, the thermal plane having thermal interface material; laterally conducting heat along said plane; and conducting heat out of said plane through the thermal interface material, wherein the thermal interface material are aligned carbon nanotube arrays.

In other embodiments, a method for thermal connection is disclosed. The method comprises separating a heat source and a heat sink by placing a spacer in a positional relationship with the heat source and heat sink; growing a first aligned carbon nanotube array in a first perpendicular direction from a heat source; growing a second aligned carbon nanotube array in a second perpendicular direction opposite to the first perpendicular direction from a heat sink; coupling the first and second carbon nanotube arrays by allowing the growth of the first carbon nanotube array to connect with the growth of the second nanotube array.

In some embodiments, there is disclosed a method of fabricating an electronic system, comprising actions of a) forming a dry carbon nanotube (CNT) array on a heat spreader; b) thereafter positioning a packaged electronic device in a position which is spaced from at least part of said dry CNT array; and c) growing carbon nanotubes from both said CNT array and said packaged device, to thereby form a unified CNT array which provides a low-resistance heat path from said device to said heat spreader.

In another embodiment, there is disclosed a method of fabricating an electronic system, comprising actions of a) forming a dry CNT array on a heat spreader; b) thereafter positioning a packaged electronic device in a position which is spaced from at least part of said dry CNT array by a spacer; and c) growing carbon nanotubes from both said CNT array and said packaged device, to thereby, form a unified CNT array which provides a low-resistance heat path from said device to said heat spreader.

Another embodiment discloses a thermal management structure, comprising a heat source, thermally linked to a heat spreader by an aligned nanotube array and a heat sink, also thermally linked to said heat spreader by another aligned nanotube array.

In another embodiment, a method is disclosed for operating an electronic device, comprising actions of conducting heat from a heat source to a heat spreader through an aligned nanotube array; and conducting heat from said heat spreader to a heat sink through another aligned nanotube array.

In another embodiment, a cooling structure is disclosed comprising a heat source, which is operatively coupled to drive heat flow through an aligned nanotube array; and a convective cooling area, where at least some of said aligned nanotube array couples heat to a fluid.

Some other embodiments disclose a method for operating an electronic device, comprising actions of conducting heat from a heat source to a heat spreader through an aligned nanotube array; and conducting heat from said heat spreader to a heat sink through another aligned nanotube array.

The foregoing, detailed description and accompanying drawings are only illustrative and not restrictive. It is to be understood that the general nature revealed in the invention may be sufficient to those skilled in the art to devise with addition, deletion, modification and adaptation in various applications as well as alternative arrangements without departing from the spirit of the disclosed embodiments and the scope of the appended claims.

Modifications and Variations

As will be recognized by those skilled in the art, the innovative concepts described in the present application can be modified and varied over a tremendous range of applications and accordingly the scope of patented subject matter is not limited by any of the specific exemplary teachings given.

For example, it should be noted that a heat source may be a heat dissipation structure that generates heat when in operation or may be a structure having a high temperature. The heat dissipation structure could be a die, device, a module or a combination of several dies, devices, modules or even a heat spreader that dissipates heat to a heat sink.

Similarly, a cooler may be a structure that absorbs heat and further may help to dissipate heat to other media including a heat spreader, a heat sink, or even ambient air or a fluid.

Note that the carbon nanotube array can be used not only to couple to a gas phase for convective or forced cooling, but also to a liquid phase.

The carbon nanotube (CNT) arrays of the inventions may be grown or synthesized using processes such as thermal chemical vapor deposition, plasma enhanced chemical vapor deposition, arc discharging, or laser ablation. The carbon nanotubes (CNTs) are usually grown in a perpendicular alignment to the substrate.

In some embodiments a high thermal conductivity substrate may, form particular patterns specific to certain applications and the CNT arrays may be grown within the particular pattern. The high thermal conductivity substrate comprises one of silicon, silicon oxide, silicon with silicon oxide layer, glass, some metals such as aluminum, copper, some metal alloys such as aluminum alloy, copper alloy, or these metals or metal alloys with their oxide layers, or oxide of these metals or metal alloys, or any materials containing at least one of the above materials. The CNT arrays may be grown by using sublimed catalysts such as dicyclopentadienyl iron (Ferrocene), dicyclopentadienyl cobalt (Cobaltocene), dicyclopentadienyl nickel (Nickelocene), iron titanium hydride, cobalt titanium hydride, nickel titanium hydride, or similar compounds containing at least one of these substances. CNT arrays may be grown from preformed catalyst dispersed on the high thermal conductivity substrate surfaces. Deformed catalyst types include iron, nickel, cobalt, aluminum, silicon, copper, platinum, palladium, gold, silver, oxides of these materials, and any combination or compound of these substances and/or their oxides.

Some embodiments may, include a modification layer formed on the high thermal conductivity substrate surface that is operational to modify the distribution and density of the CNT arrays and modify the bonding between the CNT and the high thermal conductivity substrate surfaces. The modification layer may at least one of titanium, tungsten, silicon, aluminum, oxides of these elements, or any compounds containing at least one of these elements.

In some embodiments, the electronic system is comprised of CNT arrays disposed in a gap exposed between a heat source and a cooler. Adhesive material may be placed around the outside edges of the exposed gap. The adhesive material may include epoxy resin with or without fillers, thermal conductive polymers, a low melting metal or alloy, a phase change material, adhesive materials, or any substances containing any of these materials.

In some embodiments, the CNT arrays increase the heat dissipation from the electronic structure by operating as heat fins. The CNT heat fins significantly increase the heat dissipation area of the heat, dissipation structure resulting in increased heat dissipation to the environment by heat convection. The CNT arrays are positioned to effectively dissipate the heat into the environment by thermal convection.

CNT arrays may be grown or synthesized into a specific pattern required for a particular application or may be adapted for a specific feature of an application.

In some embodiments, aligned CNT arrays may be grown to vertically extend from a heat source surface or a cooler surface and may be grown until contact is made to the opposite surface. In other embodiments, aligned CNT arrays may be grown to vertically extend from a heat source surface and a cooler surface and may be grown until the opposite CNT arrays overlap.

In one embodiment, the dimensions of the heat source and the cooler may be the same; the dimensions of the electronic structures may be device and application dependent. One example may be a 1 W LED package where the heat source is 1 millimeter (mm) by 1 mm and the cooler or heat sink is 20 mm by 20 mm. In other applications, the heat source may be much larger than 1 mm by 1 mm and the heat sink will be a corresponding dimension.

None of the description the present application should be construed as implying that any particular element, step, or function is an essential element which must be included in the claim scope THE SCOPE OF PATENTED SUBJECT MATTER IS DEFINED ONLY BY THE ALLOWED CLAIMS. Moreover, none of these claims are intended to invoke paragraph six of 35 U.S.C. section 112 unless the exact words "means for" are followed by a participle.

The claims as filed are intended to be as comprehensive as possible, and NO subject matter is intentionally relinquished, dedicated, or abandoned.

What is claimed is:

1. A packaged semiconductor structure, comprising:
   a heat source;
   a heat sink;
   an aligned array of carbon nanotubes comprising a first portion of the carbon nanotubes formed, from a first direction directly on a first surface of the heat source, a second portion of the carbon nanotubes that is different in position from the first portion, formed from a second direction, distinct from the first direction, directly on a second surface of the heat sink, and a third portion of the carbon nanotubes that is different in position from the first portion and the second portion, formed from the first direction directly on the first portion to contact the second portion, wherein a first sidewall of the first portion of the carbon nanotubes and a second sidewall of the second portion of the carbon nanotubes overlap and connect, via the third portion, from the first direction and the second direction to thermally connect the heat source to the heat sink, thereby forming a structural gap between the heat source and the heat sink; and
   a peripheral connecting adhesive that runs along at least a portion of an outside edge of the structural gap and adheres and permanently bonds a portion of an outside surface of the heat source to outside edges of the first portion of the carbon nanotubes and the second portion of the carbon nanotubes.

2. The packaged semiconductor structure of claim 1, wherein the heat sink comprises a structure that dissipates heat to at least one of a lower temperature structure or a surrounding environment in response to one or more parts of the structure being operated.

3. The packaged semiconductor structure of claim 1, wherein the heat sink comprises a substrate having high thermal conductivity.

4. The packaged semiconductor structure of claim 3, wherein the substrate comprises at least one of a metal, a metal alloy, or a ceramic material.

5. The packaged semiconductor structure of claim 1, wherein the aligned array of the carbon nanotubes comprises patterned carbon nanotubes in a patterned configuration.

6. The packaged semiconductor structure of claim 1, wherein at least one of the second surface of the heat sink or the first surface of the heat source further comprises a modification layer facing the aligned array of carbon nanotubes, and wherein the modification layer affects at least one of a distribution, a density, or a bonding of the aligned array of the carbon nanotubes.

7. The packaged semiconductor structure of claim 1, wherein the heat sink comprises another aligned array of carbon nanotubes that forms a plurality of convective cooling fins.

8. The packaged semiconductor structure of claim 1, wherein the heat source comprises an electronic structure having a temperature that is higher than a temperature of the heat sink in response to one or more parts of the electronic structure begin operated.

9. The packaged semiconductor structure of claim 1, wherein the heat sink comprises another array of carbon nanotubes that forms a plurality of convective cooling fins, wherein an edge of the plurality of convective cooling fins contacts the peripheral connecting adhesive.

10. The packaged semiconductor structure of claim 1, wherein the peripheral connecting adhesive provides a fixed positional relationship and permanent bonding between the heat source and the heat sink.

11. The packaged semiconductor structure of claim 1, wherein the peripheral connecting adhesive adheres and permanently bonds the portion of the outside surface of the heat source to a portion of an outside surface of the heat sink.

12. A packaged electronic device, comprising:
    a first portion of a first aligned array of carbon nanotubes formed from a first direction directly on a first surface of a heat source;
    a second portion of the first aligned array of carbon nanotubes that is different in position from the first portion, formed from a second direction that is different from the first direction, directly on a second surface of a heat dissipation structure;
    a third portion of the first aligned array of carbon nanotubes that is different in position from the first portion and the second portion, formed from the first direction directly on the first portion to contact the second portion, wherein a first sidewall of the first portion and a second sidewall of the second portion overlap from the first direction and the second direction and thermally connect, via the third portion, the heat source to the heat dissipation structure;
    a second aligned array of carbon nanotubes thermally coupled to the heat dissipation structure; and
    a peripheral connecting adhesive applied along an outside edge of a gap between the heat source and the heat dissipation structure, and that adheres and permanently bonds a portion of an outside surface of the heat source to another portion of a surface of the heat dissipation structure.

13. The packaged electronic device of claim 12, wherein the peripheral connecting adhesive provides a fixed positional relationship and a permanent bonding between the heat source and the heat dissipation structure.

14. The packaged electronic device of claim 12, wherein the heat dissipation structure comprises a substrate having high thermal conductivity.

15. The packaged electronic device of claim 14, wherein the substrate comprises at least one of a metal, a metal alloy, or a ceramic material.

16. The packaged electronic device of claim 12, wherein at least one of the first surface of the heat source or the second surface of the heat dissipation structure further comprises a modification layer facing the first aligned array of carbon nanotubes, wherein the modification layer controls at least one of a distribution, a density, or a bonding of at least one of the first portion or the second portion.

17. The packaged electronic device of claim 12, wherein at least one of the first aligned array of carbon nanotubes or the second aligned array of carbon nanotubes comprises at least one aligned array of carbon nanotubes in a patterned configuration.

18. The packaged electronic device of claim 12, wherein at least a portion of at least one of the first aligned array of carbon nanotubes or the second aligned array of carbon nanotubes forms a plurality of fins for convective cooling.

19. The packaged electronic device of claim 12, wherein the heat source comprises an electronic structure having a temperature that is higher than a temperature of the heat dissipation structure in response to one or more portions of the electronic structure being operated.

20. The packaged electronic device of claim 12, wherein at least a portion of at least one of the first aligned array of carbon nanotubes or the second aligned array of carbon nanotubes forms a plurality of convective cooling fins, wherein an edge of the plurality of convective cooling fins contacts the peripheral connecting adhesive.

21. The packaged semiconductor structure of claim 12, wherein the peripheral connecting adhesive adheres and permanently bonds the portion of the outside surface of the heat source to the other portion of the surface of the heat dissipation structure that is aligned or substantially aligned with the portion of the outside surface of the heat source.

\* \* \* \* \*